(12) United States Patent
Nakamura (10) Patent No.: US 12,368,387 B2
(45) Date of Patent: Jul. 22, 2025

(54) POWER CONVERSION DEVICE WITH BOARD RETENTION MEMBER

(71) Applicant: Mitsubishi Electric Corporation, Tokyo (JP)

(72) Inventor: Takuya Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 198 days.

(21) Appl. No.: 18/095,111

(22) Filed: Jan. 10, 2023

(65) Prior Publication Data
US 2024/0048064 A1    Feb. 8, 2024

(30) Foreign Application Priority Data
Aug. 2, 2022 (JP) .................. 2022-123182

(51) Int. Cl.
| | |
|---|---|
| *H02M 7/00* | (2006.01) |
| *H01L 23/473* | (2006.01) |
| *H05K 7/14* | (2006.01) |
| *H05K 7/20* | (2006.01) |

(52) U.S. Cl.
CPC ........ *H02M 7/003* (2013.01); *H05K 7/20927* (2013.01); *H01L 23/473* (2013.01); *H05K 7/14322* (2022.08)

(58) Field of Classification Search
CPC .............. H05K 7/209; H05K 7/20927; H05K 7/20254; H05K 7/14322; H01L 23/473; H02M 7/003
See application file for complete search history.

(56) References Cited

U.S. PATENT DOCUMENTS

| | | | |
|---|---|---|---|
| 7,965,510 B2* | 6/2011 | Suzuki .................. | B60K 6/405 361/689 |
| 8,829,669 B2* | 9/2014 | Hotta .................. | H01L 23/4006 257/714 |
| 11,744,052 B2* | 8/2023 | Muller ............... | H05K 7/20872 361/699 |
| 2015/0102821 A1* | 4/2015 | Henrici ............... | G01R 31/385 29/874 |
| 2020/0051887 A1* | 2/2020 | Aoki ...................... | H05K 1/181 |
| 2021/0233830 A1* | 7/2021 | Oka ....................... | H01L 23/367 |

FOREIGN PATENT DOCUMENTS

| | | | | |
|---|---|---|---|---|
| JP | 2011131421 A | * | 7/2011 | ............ B29C 45/02 |
| JP | 6369355 B2 | | 8/2018 | |

* cited by examiner

*Primary Examiner* — Zachary Pape
(74) *Attorney, Agent, or Firm* — Sughrue Mion, PLLC (57) ABSTRACT

This power conversion device includes: a cooler having a cooling surface; one or a plurality of power modules and thermally connected to the cooling surface; a board placed with a space from the power module; and a board-retention member, the board-retention member including an extending portion which extends in the first direction through the space between the board and the power module, and supports the board, a first fixation portion which is connected to an end on the one side in the first direction of the extending portion and is fixed to the cooler on the one side in the first direction of the power module, and a second fixation portion which is connected to an end on the other side in the first direction of the extending portion and is fixed to the cooler on the other side in the first direction of the power module.

2 Claims, 9 Drawing Sheets

POWER CONVERSION DEVICE WITH BOARD RETENTION MEMBER

BACKGROUND

The present disclosure relates to a power conversion device.

Electrified vehicles such as hybrid vehicles (HV), plug-in hybrid vehicles (PHV, PHEV), electric vehicles (EV), and fuel cell vehicles (FCV) are provided with a power conversion device which is a component for electrification. Examples of power conversion devices include an inverter for converting DC power from a battery to AC power for a motor and supplying the AC power to the motor for driving, and a converter for boosting voltage of a battery. In recent years, such power conversion devices have been required to be reduced in cost.

In addition, in the HV, the PHV, and the PHEV, a power conversion device as well as an engine is mounted inside an engine room. Therefore, a small-sized power conversion device is often required. Also, in the EV, a driving motor and an inverter may be mounted on the rear side, and for ensuring a trunk room and an occupant compartment space, a small-sized power conversion device is often required.

Further, in recent years, there have been increasing cases where, for shortening a connection harness of power conversion devices, the number of housings of the power conversion devices is decreased, and for achieving cost reduction and size reduction, power conversion devices such as an inverter are rigid-connected directly to a housing of a motor, an engine, or a transmission. Therefore, the internal components of the power conversion device are required to meet strict vibration specifications. A general power conversion device structure that meets strict vibration specifications is disclosed (see, for example, Patent Document 1). In the structure disclosed in Patent Document 1, a board is fixed to a support portion provided to a base member which is a heat dissipation member.

Patent Document 1: Japanese Patent No. 6369355

In Patent Document 1, since the board is fixed to the base member via the support portion, a board part fixed to the base member can meet strict vibration specifications. However, a board part opposed to a power module has no portion fixed to the base member. Thus, there is a problem that the board part opposed to the power module cannot meet strict vibration specifications. In addition, there is a problem that the size of the base member increases in a case of newly providing a support portion to the base member to retain the board part opposed to the power module.

SUMMARY

Accordingly, an object of the present disclosure is to provide a power conversion device that is improved in vibration resistance while suppressing size increase.

A power conversion device according to the present disclosure includes a cooler having a cooling surface; one or a plurality of power modules arranged above the cooling surface and thermally connected to the cooling surface; a board placed with a space from the one or plurality of power modules on a side of the one or plurality of power modules that is opposite to the cooling surface, the board being electrically connected to a terminal of the one or plurality of power modules; and a board-retention member. One direction parallel to the cooling surface is defined as a first direction and a direction parallel to the cooling surface and perpendicular to the first direction is defined as a second direction. The board-retention member includes an extending portion which extends in the first direction through the space between the board and the one or plurality of power modules so as to straddle the one or plurality of power modules from one side to another side in the first direction, and supports the board, a first fixation portion which is connected to an end on the one side in the first direction of the extending portion and is fixed to the cooler on the one side in the first direction of the one or plurality of power modules, and a second fixation portion which is connected to an end on the other side in the first direction of the extending portion and is fixed to the cooler on the other side in the first direction of the one or plurality of power modules.

The power conversion device according to the present disclosure includes the cooler having the cooling surface; the one or plurality of power modules arranged above the cooling surface and thermally connected to the cooling surface; the board placed with the space from the power modules; and the board-retention member including the extending portion which extends in the first direction through the space between the board and the power modules so as to straddle the power modules from the one side to the other side in the first direction, and supports the board, the first fixation portion which is connected to the end on the one side in the first direction of the extending portion and is fixed to the cooler on the one side in the first direction of the power modules, and the second fixation portion which is connected to the end on the other side in the first direction of the extending portion and is fixed to the cooler on the other side in the first direction of the power modules. Thus, since the board is supported by the board-retention member at a part between the power module and the board, it is possible to provide the power conversion device that is improved in vibration resistance while suppressing size increase of the power conversion device in the first direction and the second direction.

DETAILED DESCRIPTION OF THE EMBODIMENTS

Hereinafter, a power conversion device according to embodiments of the present disclosure will be described with reference to the drawings. In the drawings, the same or corresponding members and parts are denoted by the same reference characters, to give description.

First Embodiment

Figure 1:
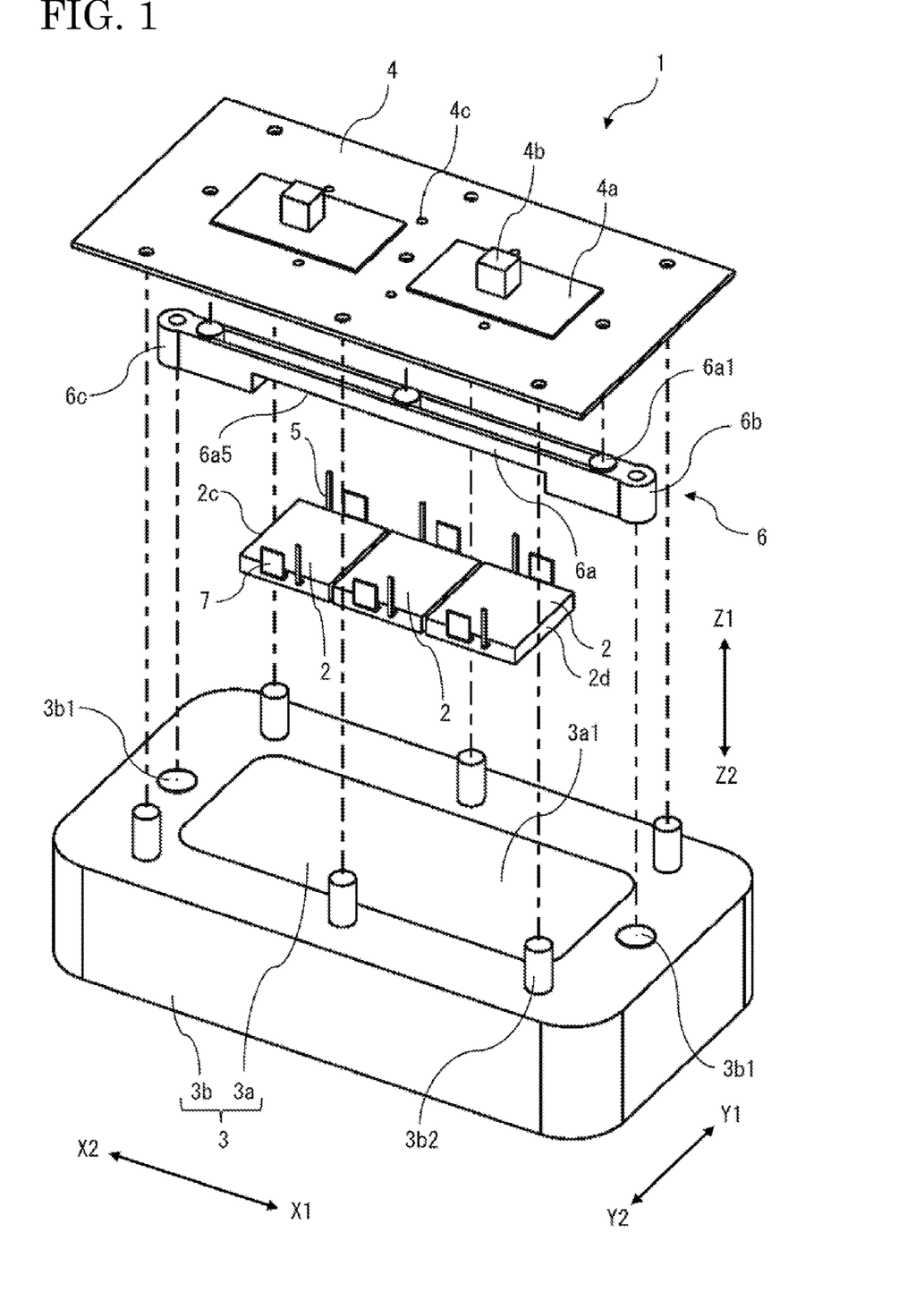
FIG. 1 is an exploded perspective view schematically showing a power conversion device according to the first embodiment of the present disclosure.
Figure 2:
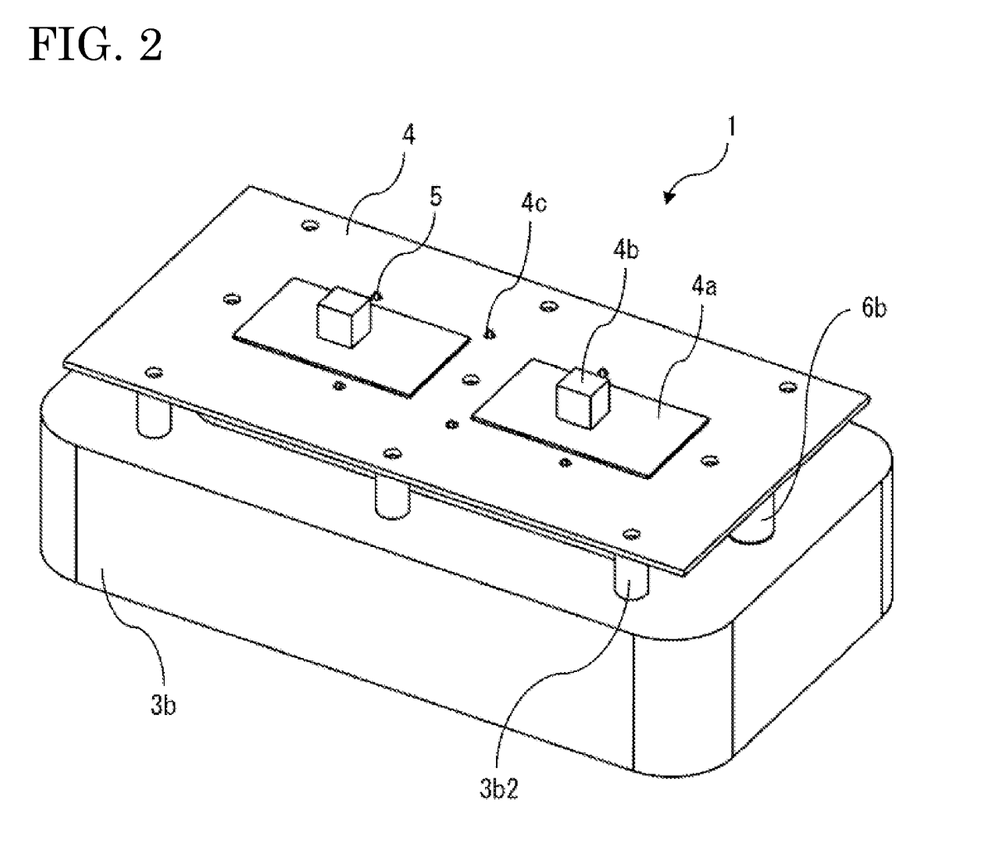
FIG. 2 is a perspective view schematically showing the power conversion device according to the first embodiment.
Figure 3:
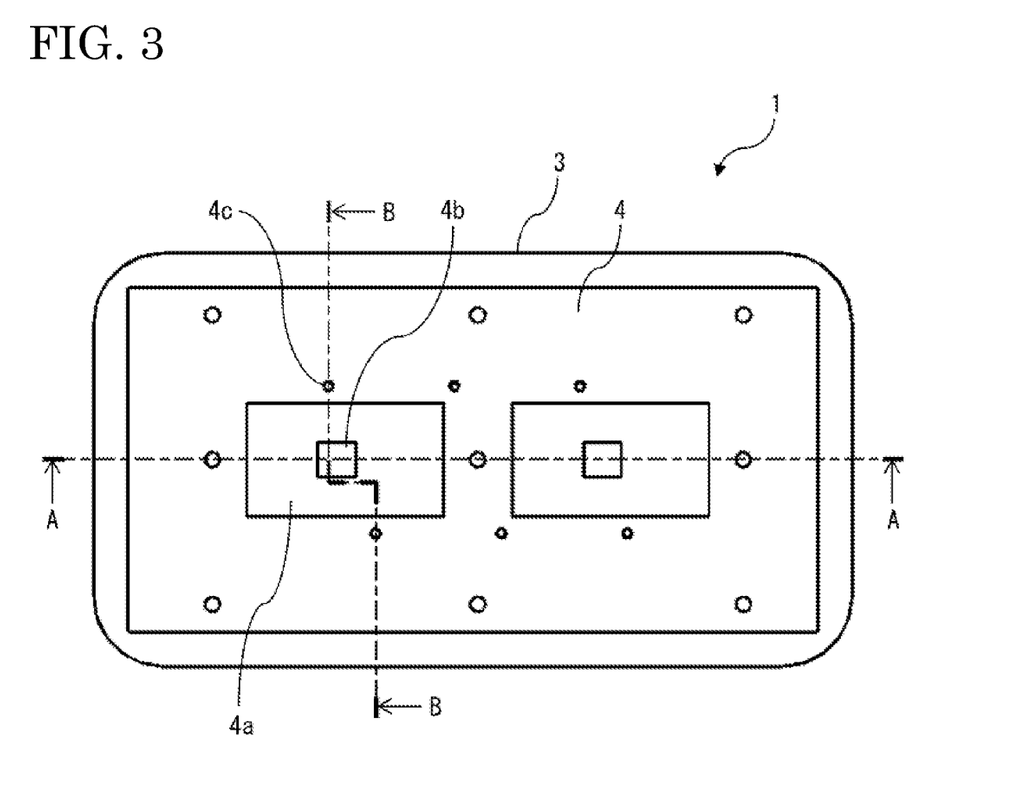
FIG. 3 is a plan view schematically showing the power conversion device according to the first embodiment.
Figure 4:
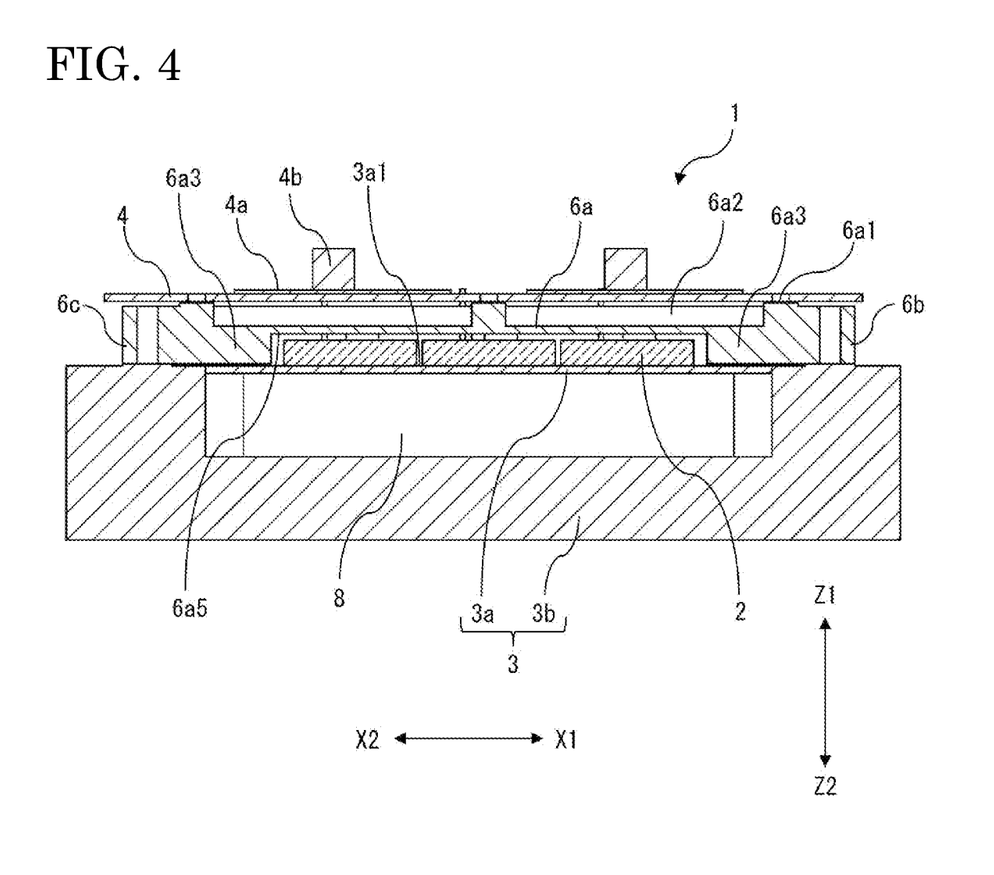
FIG. 4 is a sectional view of the power conversion device taken at an A-A cross-section position in FIG. 3.
Figure 5:
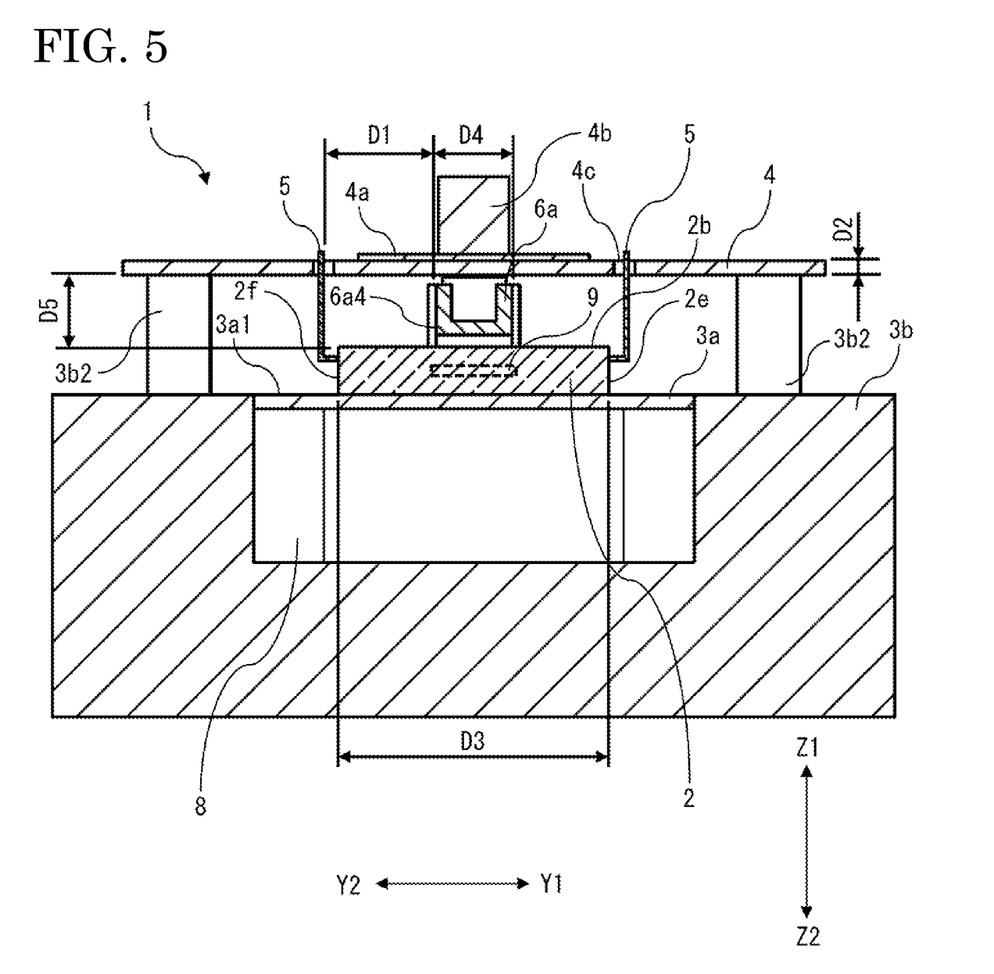
FIG. 5 is a sectional view of the power conversion device taken at a B-B cross-section position in FIG. 3.
Figure 6:
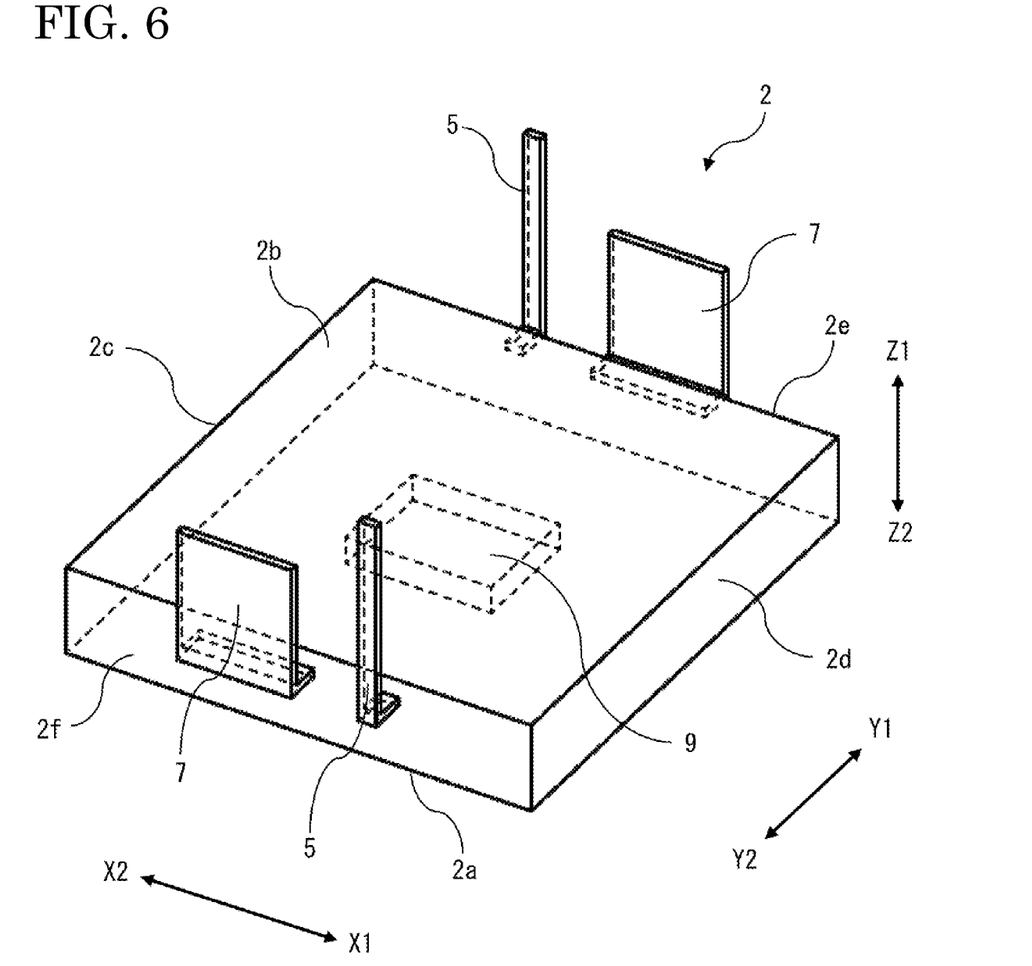
FIG. 6 is a perspective view showing a power module of the power conversion device according to the first embodiment.
Figure 7:
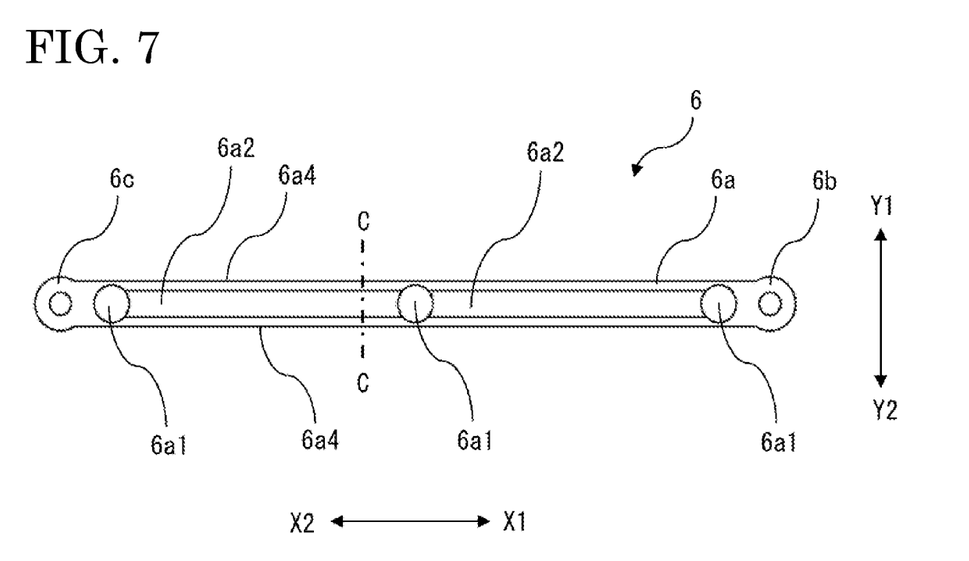
FIG. 7 is a plan view showing a board-retention member of the power conversion device according to the first embodiment.
Figure 8:
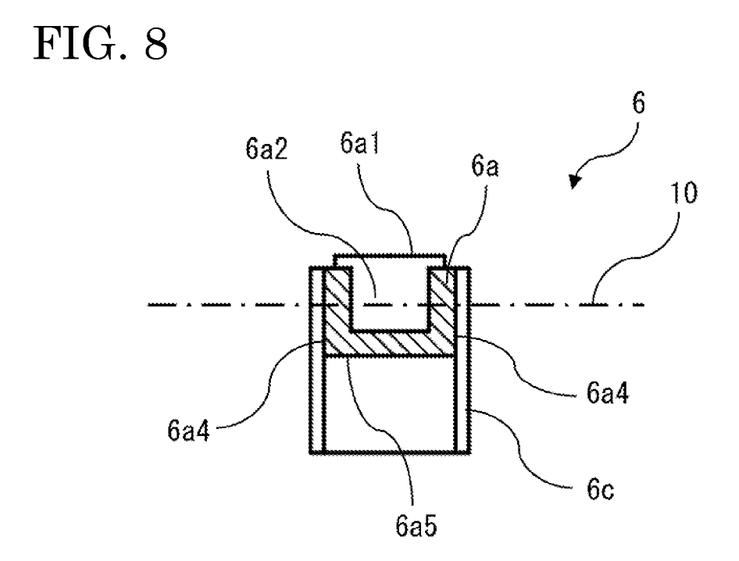
FIG. 8 is a sectional view of the board-retention member taken at a C-C cross-section position in FIG. 7.
Figure 9:
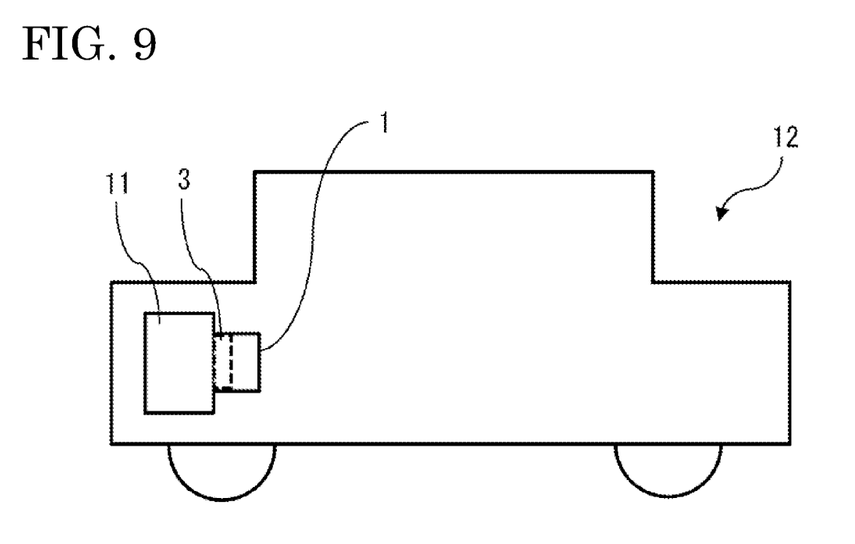
FIG. 9 shows an example of an installation state of the power conversion device according to the first embodiment.

FIG. 1 is an exploded perspective view schematically showing a power conversion device 1 according to the first embodiment of the present disclosure. FIG. 2 is a perspective view schematically showing the power conversion device 1. FIG. 3 is a plan view schematically showing the power conversion device 1. FIG. 4 is a sectional view of the power conversion device 1 taken at an A-A cross-section position in FIG. 3. FIG. 5 is a sectional view of the power conversion device 1 taken at a B-B cross-section position in FIG. 3. FIG. 6 is a perspective view showing a power module 2 of the power conversion device 1. FIG. 7 is a plan view showing a board-retention member 6 of the power conversion device 1. FIG. 8 is a sectional view of the board-retention member 6 taken at a C-C cross-section position in FIG. 7. FIG. 9 shows an example of an installation state of the power conversion device 1. The power conversion device 1 is a device for converting input current from DC to AC or from AC to DC, or converting input voltage to different voltage.

The power conversion device 1 includes: a cooler 3 having a cooling surface 3a1; one or a plurality of power modules 2 arranged above the cooling surface 3a1 and thermally connected to the cooling surface 3a1; a board 4 placed with a space from the one or a plurality of power modules 2 on a side of the one or a plurality of power modules 2 that is opposite to the cooling surface 3a1, the board 4 being electrically connected to terminals 5 of the one or plurality of power modules 2; and a board-retention member 6 retaining the board 4 and fixing the board 4 to the cooler 3. In the present embodiment, as shown in FIG. 1, the power conversion device 1 includes three power modules 2. However, the number of the power modules 2 included in the power conversion device 1 is not limited thereto. The number of the power modules 2 may be one, or four or more. The power conversion device 1 in the present embodiment is a device that performs power conversion of DC power by the power modules 2 and outputs three-phase AC power. The power conversion device 1 includes three power modules 2 corresponding to the respective phases. The power conversion device 1 is not limited to this configuration, and may be a device for converting input current from AC to DC.

<Power Module 2>

With reference to FIG. 6, the power module 2 will be described. Although only one power module 2 is shown in FIG. 6, the other power modules 2 have the same configuration. The power module 2 includes a semiconductor chip 9. In FIG. 6, the semiconductor chip 9 is indicated by a broken line. The number of the semiconductor chips 9 included in one power module 2 is not limited to one, and the power module 2 may include a plurality of semiconductor chips 9.

The power module 2 is formed in a rectangular parallelepiped shape having a first surface 2a, a second surface 2b opposite to the first surface 2a, and four side surfaces surrounding the first surface 2a and the second surface 2b. The four side surfaces are a first side surface 2c, a second side surface 2d opposite to the first side surface 2c, a third side surface 2e, and a fourth side surface 2f opposite to the third side surface 2e. The first surface 2a of the power module 2 is thermally connected to the cooling surface 3a1 via a joining member (not shown). The joining member is, for example, solder.

One direction parallel to the cooling surface 3a1 is defined as a first direction, a direction parallel to the cooling surface 3a1 and perpendicular to the first direction is defined as a second direction, and a direction perpendicular to the first direction and the second direction is defined as a third direction. In the drawings, the first direction is defined as an X direction, a side toward X1 is defined as one side in the first direction, and a side toward X2 is defined as another side in the first direction. The second direction is defined as a Y direction, a side toward Y1 is defined as one side in the second direction, and a side toward Y2 is defined as another side in the second direction. The third direction is defined as a Z direction, a side toward Z1 is defined as one side in the third direction, and a side toward Z2 is defined as another side in the third direction. The three power modules 2 are placed so as to be arranged with the same orientation in the first direction such that the direction from the first side surface 2c to the second side surface 2d of each power module 2 is parallel to the first direction, as shown in FIG. 1.

Placement of the plurality of power modules 2 is not limited to the placement in which they are arranged with the same orientation in the first direction. However, with this structure, since the plurality of power modules 2 are placed so as to be aligned in the same direction, the power conversion device 1 can be downsized. In a case of providing more power modules 2, the power modules 2 may be placed so as to be aligned in two rows.

As shown in FIG. 6, the power module 2 includes power terminals 7, and the terminals 5 connected to the board 4. The terminals 5 and the power terminals 7 are provided so as to protrude from a body part of the power module 2. The terminals 5 and the power terminals 7 are made of copper which is small in electrical resistivity and excellent in electric conductivity, for example. The terminals 5 are terminals relevant to driving of the power module 2. The power terminals 7 are terminals relevant to input/output of the power module 2. For example, one power terminal 7 is connected to a DC power supply, and the other power terminal 7 is connected to a motor which is a load.

The terminal 5 protrudes from at least one of the second surface 2b, the third side surface 2e, and the fourth side surface 2f of the power module 2, and then extends toward the board 4, to be connected to the board 4 at a board-connection portion 4c of the board 4. In the present embodiment, one terminal 5 is provided at each of the third side surface 2e and the fourth side surface 2f of the power module 2. The number of the terminals 5 is not limited thereto, and more terminals 5 may be provided.

The power module 2 is molded by transfer molding. Thus, the semiconductor chip 9 is surrounded by mold resin. With this structure, the semiconductor chip 9 can be easily protected from outside. In addition, although it is difficult to retain the board 4 at the power module 2 molded by transfer molding, in the present disclosure, since the board-retention member 6 retaining the board 4 and fixing the board 4 to the cooler 3 is provided, the vibration resistance of the board 4 can be improved without retaining the board 4 at the power module 2. The details of the structure of the board-retention member 6 will be described later. The structure of the power module 2 is not limited to the transfer-molded structure, and may be such a structure that the semiconductor chip 9 is stored in a case and gel fills the inside of the case.

<Cooler 3>

As shown in FIG. 4, a flow path 8 through which a coolant flows is provided inside the cooler 3. The cooler 3 includes a housing portion 3b which is formed in a bottomed tubular shape having a bottom on the other side in the third direction and surrounds the flow path 8, and a lid portion 3a covering the flow path 8 from the one side in the third direction and having the cooling surface 3a1 on the one side in the third direction. In the present embodiment, the housing portion 3b surrounds the flow path 8 from both sides in the first direction, both sides in the second direction, and the other side in the third direction. As the coolant, for example, water or an ethylene glycol solution is used. The housing portion 3b is manufactured by die casting from metal such as aluminum. The lid portion 3a is, for example, a forged aluminum alloy.

<Board 4>

As shown in FIG. 2, the board 4 has, on the one side in the third direction, a driving circuit 4a for driving the power module 2 and a mounted component 4b connected to the driving circuit 4a. The mounted component 4b is, for example, a transformer. The mounted component 4b, such as a transformer, which is weak against vibration, is placed, together with the driving circuit 4a, between the terminal 5 provided at the third side surface 2e and the terminal 5 provided at the fourth side surface 2f, as shown in FIG. 5. Since the driving circuit 4a is mounted to the board 4 between the terminals 5, the driving circuit 4a can be provided at a position close to the terminals 5 of the power module 2, whereby controllability for the power module 2 can be improved. In addition, the area of the board 4 can be efficiently used, and thus the board 4 can be downsized.

<Board Retention Member 6>

The board-retention member 6 which is a major part of the present disclosure will be described. As shown in FIG. 1, the board-retention member 6 includes an extending portion 6a, a first fixation portion 6b, and a second fixation portion 6c. The extending portion 6a extends in the first direction through the space between the board 4 and the power modules 2 so as to straddle the power modules 2 from the one side to the other side in the first direction, and supports the board 4. The first fixation portion 6b is connected to an end on the one side in the first direction of the extending portion 6a and is fixed to the cooler 3 on the one side in the first direction of the power modules 2. The second fixation portion 6c is connected to an end on the other side in the first direction of the extending portion 6a and is fixed to the cooler 3 on the other side in the first direction of the power modules 2. As shown in FIG. 4, the extending portion 6a and the power modules 2 are placed with a gap therebetween. A part of the extending portion 6a that is opposed to the power modules 2 is an opposed surface 6a5.

With this structure, since the board 4 is supported by the board-retention member 6 at a part between the power modules 2 and the board 4, it is possible to provide the power conversion device 1 that is improved in vibration resistance while suppressing size increase of the power conversion device 1 in the first direction and the second direction. Even in a case where a plurality of power modules 2 are provided, a member supporting the board 4 need not be provided between the plurality of power modules 2, and therefore the plurality of power modules 2 can be arranged at minimum intervals, whereby size increase of the power conversion device 1 can be suppressed. In addition, since the board-retention member 6 is placed at the gap part between the power modules 2 and the board 4, size increase of the power conversion device 1 in the third direction can be suppressed.

A board-fixation portion 6a1 which is a part supporting the board 4, of the extending portion 6a, will be described. The extending portion 6a has one or a plurality of board-fixation portions 6a1. The board 4 is fixed at the board-fixation portions 6a1 by, for example, screwing. In a case where the board 4 is fixed to the board-fixation portion 6a1 by screwing, through holes are provided in the board 4. The extending portion 6a has, at least at a center part in the first direction, the board-fixation portion 6a1 to which the board 4 is fixed. With this structure, since the board 4 is fixed to the extending portion 6a at a middle part between the power modules 2 and the board 4, the vibration resistance of the board 4 at a part between the power modules 2 and the board 4 can be efficiently improved.

In a case where the extending portion 6a has a plurality of board-fixation portions 6a1, for example, the extending portion 6a is formed to have the plurality of board-fixation portions 6a1 which are arranged in the first direction and to which the board 4 is fixed. In the present embodiment, the extending portion 6a has three board-fixation portions 6a1, and the three board-fixation portions 6a1 are respectively located at the center part in the first direction, the one side in the first direction, and the other side in the first direction, of the extending portion 6a. With this structure, since the board 4 is fixed to the extending portion 6a at the plurality of board-fixation portions 6a1, the vibration resistance of the board 4 can be further improved.

In the present embodiment, as shown in FIG. 8, the board-fixation portion 6a1 protrudes toward the board 4 side relative to a part therearound, of the extending portion 6a. With this structure, the board-fixation portion 6a1 and the board 4 can assuredly contact with each other, whereby the vibration resistance of the board 4 can be assuredly improved.

As shown in FIG. 7, a part of the extending portion 6a other than the board-fixation portions 6a1 has a groove 6a2 recessed to the side opposite to the board 4 and extending in the first direction. With this structure, the weight of the extending portion 6a is reduced, so that deflection of the extending portion 6a can be suppressed. Since deflection of the extending portion 6a is suppressed, the vibration resistance of the board 4 can be improved.

In the present embodiment, as shown in FIG. 4, the first fixation portion 6b and the second fixation portion 6c are fixed to the housing portion 3b. Parts of the housing portion 3b to which the first fixation portion 6b and the second fixation portion 6c are fixed are fixation parts 3b1 shown in FIG. 1. The first fixation portion 6b and the second fixation portion 6c are fixed at the fixation parts 3b1 by, for example, screwing. In a case where the first fixation portion 6b and the second fixation portion 6c are fixed by screwing, the through holes are provided in the first fixation portion 6b and the second fixation portion 6c. A fixation method for the first fixation portion 6b and the second fixation portion 6c at the fixation parts 3b1 is not limited to screwing, and may be welding. In a case where the lid portion 3a having the cooling surface 3a1 is a forged aluminum alloy manufactured by forging, there are constraints in terms of manufacturing by forging. Therefore, if bosses for fixing the first fixation portion 6b and the second fixation portion 6c are provided to the lid portion 3a, the manufacturing cost increases. It is possible to suppress increase in the manufacturing cost by providing bosses as the fixation part 3b1 to the housing portion 3b manufactured by aluminum die casting.

The extending portion 6a has, at one or both of a part on the one side in the first direction and a part on the other side in the first direction relative to the power modules 2, a part protruding toward the cooler 3 side so as to be thermally connected to the cooling surface 3a1. In the present embodiment, as shown in FIG. 4, the extending portion 6a has, at both of the part on the one side in the first direction and the part on the other side in the first direction relative to the power modules 2, protrusions 6a3 which are the parts protruding toward the cooler 3 side. With this structure, heat generated at the power modules 2 can be inhibited from diffusing to the surroundings. In addition, heat generation at the board 4 can be suppressed.

In the present embodiment, as shown in FIG. 5, the extending portion 6a extends in the first direction through the space between the board 4 and a center part in the second direction of the power modules 2. With this structure, the board 4 can be supported at the center part in the second direction of the power modules 2, whereby the extending portion 6a can stably support the board 4 in a well-balanced manner. Since the board 4 is stably supported in a well-balanced manner, the vibration resistance of the board 4 can be improved.

In a case where the power module 2 is formed by being sealed by transfer molding, in general, the terminals 5 are formed by a copper lead frame. In comparison between the Young's moduli of the board 4 and copper, the Young's modulus of the board 4 is smaller. Therefore, through deflection of the board 4 during vibration, stress due to vibration can be received by the board 4. If rigidity of the board 4 increases by the board 4 being fixed to the board-retention member 6, the board 4 does not deflect during vibration, and therefore stress concentrates on the terminal 5 during vibration, so that the terminal 5 might be damaged. In the present embodiment, the extending portion 6a has, on the one side and the other side in the second direction, retention side surfaces 6a4 parallel to the first direction and perpendicular to the second direction, and as seen in a direction perpendicular to the cooling surface 3a1, a distance from the retention side surface 6a4 to the board-connection portion 4c adjacent to the retention side surface 6a4 is not less than six times the thickness of the board. In FIG. 5, the above distance between the retention side surface 6a4 and the board-connection portion 4c is denoted by D1, and the thickness of the board 4 is denoted by D2. With this structure, the vibration resistances of the terminals 5 which are weak against vibration can be ensured. In the present embodiment, since the terminal 5 is provided at each of the third side surface 2e and the fourth side surface 2f of the power module 2, the distance D1 between the board-connection portion 4c of each terminal 5 and the retention side surface 6a4 adjacent to each terminal 5 is set to be not less than six times the thickness D2 of the board 4. The value of six times has been obtained through simulation, and the effect of improving the vibration resistances of the terminals 5 has been significantly obtained in the above case of setting at not less than six times.

A width between the third side surface 2e and the fourth side surface 2f of the power module 2 is greater than a width between the retention side surfaces 6a4 of the extending portion 6a. In FIG. 5, the width between the third side surface 2e and the fourth side surface 2f is denoted by D3, and the width between the retention side surfaces 6a4 is denoted by D4. With this structure, the distances from the retention side surfaces 6a4 to the board-connection portions 4c adjacent to the retention side surfaces 6a4 can be ensured, whereby the vibration resistances of the terminals 5 which are weak against vibration can be ensured.

As seen in a direction perpendicular to the cooling surface 3a1, at least a part of the board-retention member 6 and the mounted component 4b are located so as to overlap each other. In the present embodiment, the mounted component 4b is, for example, a transformer which is weak against vibration, and as shown in FIG. 5, the board-retention member 6 and the mounted component 4b are located so as to overlap each other. With this structure, even if the mounted component 4b is a component which is weak against vibration, since the mounted component 4b is mounted closely to the board-retention member 6, the vibration resistance of the mounted component 4b can be ensured.

In the present embodiment, the board-retention member 6 is made of metal such as an aluminum alloy. In a case where the board-retention member 6 is made of metal, the board-retention member 6 is electrically connected to the board 4 and the housing portion 3b. With this structure, the housing portion 3b which is a ground and a ground of the board 4 are connected via the board-retention member 6, whereby a ground pattern necessary for the mounted component 4b of the driving circuit 4a can be easily provided to the board 4. In addition, in the case where the board-retention member 6 is made of metal, since the Young's modulus of the board-retention member 6 is higher than that of the board 4, the vibration resistance of the board 4 fixed to the board-retention member 6 can be improved.

In the present embodiment, as seen in a direction perpendicular to the cooling surface, at least a part of the semiconductor chip 9 and the board-retention member 6 are located so as to overlap each other. As shown in FIG. 5, the semiconductor chip 9 indicated by a broken line and the board-retention member 6 made of metal are located so as to overlap each other. With this structure, since the board-retention member 6 is located between the semiconductor chip 9 and the board 4, and the board-retention member 6 is connected to the ground, the board-retention member 6 can serve as a noise shield for shielding noise occurring during switching of the semiconductor chip 9. Since the board-retention member 6 serves as the noise shield, it is not necessary to newly add a noise shield, so that productivity of the power conversion device 1 can be improved.

For improving the vibration resistance of the board 4, it is desirable to ensure rigidity of the board-retention member 6 to which the board 4 is fixed. For ensuring rigidity of the board-retention member 6, where an axis extending in the second direction is defined as an X axis 10, the second moment of area of the board-retention member 6 about the X axis 10 is required to be increased. The calculation formula for the second moment of area I in a rectangular cross-section is represented by Expression (1).

$$I = b \times h^3 / 12 \tag{1}$$

In Expression (1), b is the width of the rectangle and h is the height thereof. In the structure having a rectangular cross-section, the second moment of area can be increased by increasing the width b and the height h.

If the distance in the third direction between the board 4 and the power module 2 is shortened, the height h of the extending portion 6a of the board-retention member 6 is limited, and therefore it is difficult to increase the second moment of area of the extending portion 6a. In the present disclosure, the first fixation portion 6b and the second fixation portion 6c of the board-retention member 6 are provided on the one side and the other side in the first direction of the power modules 2. Since the first fixation portion 6b and the second fixation portion 6c can be ensured to have a greater height h than the extending portion 6a, the second moments of area of the first fixation portion 6b and the second fixation portion 6c about the X axis 10 are greater than the second moment of area of the extending portion 6a about the X axis 10. Rigidity of the board-retention member 6 can be ensured by increasing the second moments of area of the first fixation portion 6b and the second fixation portion 6c.

The board 4 is rigid-connected to the board-retention member 6 whose rigidity is ensured as described above, whereby deflection of the board 4 can be suppressed and thus the vibration resistance of the mounted component 4b mounted to the board 4 can be improved. Rigid-connection is such connection that both members connected to each other do not deflect at the connection part.

For ensuring rigidity of the board-retention member 6, deflection at the part of the extending portion 6a that is opposed to the power module 2 is required to be suppressed. The calculation formula for deflection δ at the beam center is represented by Expression (2).

$$\delta = w \times l^4 / (384 \times E \times I) \quad (2)$$

In Expression (2), w is the uniformly distributed load (the self-weight of the extending part opposed to the power module 2 in the extending portion 6a), l is the beam length (the length of the extending part opposed to the power module 2 in the extending portion 6a), E is the Young's modulus, and I is the second moment of area.

The beam length l depends on the size of the power module 2, and therefore it is difficult to reduce the beam length l. Due to limitation of the height h, it is difficult to increase the second moment of area I about the X axis 10 at the extending part opposed to the power module 2 in the extending portion 6a. Therefore, the beam length l and the second moment of area I in Expression (2) are limited, under the structure of the present disclosure. However, the deflection δ at the beam center can be suppressed by the uniformly distributed load w and the Young's modulus E. Specifically, the deflection δ at the beam center can be suppressed by reducing the self-weight of the extending part opposed to the power module 2 in the extending portion 6a. In addition, the deflection δ at the beam center can be suppressed by using, for the board-retention member 6, a material having a higher Young's modulus E than the Young's modulus of the board 4. In the present embodiment, since the part of the extending portion 6a other than the board-fixation portions 6a1 has the groove 6a2 recessed to the side opposite to the board 4 and extending in the first direction, the self-weight of the extending part opposed to the power module 2 in the extending portion 6a is reduced, whereby the deflection δ at the beam center can be suppressed. In the present embodiment, since the board-retention member 6 is made of metal, the Young's modulus of the board-retention member 6 is higher than that of the board 4, so that the deflection δ at the beam center can be suppressed.

In FIG. 5, the interval between the second surface 2b of the power module 2 and the board 4 is denoted by D5. By reducing D5, the power conversion device 1 can be downsized and the lengths of the terminals 5 can be shortened. Since the lengths of the terminals 5 are shortened, the number of cavities of a transfer molding mold for the power module 2 can be increased. Further, in a case where the material of the terminals 5 is formed by a lead frame, a lead frame with a small area can be used, and thus the cost for the power conversion device 1 can be reduced. In addition, since the wiring length from the power module 2 to the driving circuit 4a is shortened, controllability for the power module 2 can be improved.

In the present embodiment, as shown in FIG. 1, the housing portion 3b has six support portions 3b2 provided on the one side in the third direction and protruding toward the one side in the third direction. The support portions 3b2 are placed around the flow path 8. The board 4 is fixed to the support portions 3b2 by, for example, screwing, in addition to fixation to the board-retention member 6. With this structure, the vibration resistance of the board 4 can be further improved. Since the support portions 3b2 are provided at a part of the housing portion 3b that surrounds the flow path 8, the size of the housing portion 3b is not increased even with the support portions 3b2 provided. Thus, size increase of the power conversion device 1 can be suppressed.

<Installation Example of Power Conversion Device 1>

The power conversion device 1 is, for example, equipment mounted to a vehicle 12. The vehicle 12 includes a vibration-causing source 11 such as an engine, a transmission, or a motor. In a case where the power conversion device 1 is mounted to the vehicle 12, the cooler 3 is rigid-connected to the vibration-causing source 11 of the vehicle 12, as shown in FIG. 9. In FIG. 9, the cooler 3 is a part indicated by a broken line. With the power conversion device 1 having the configuration as described above, it is possible to ensure the vibration resistance of the power conversion device 1 even if the cooler 3 of the power conversion device 1 is rigid-connected to the vibration-causing source 11 included in the vehicle 12 having strict requirements in vibration resistance.

As described above, the power conversion device 1 according to the first embodiment includes: the cooler 3 having the cooling surface 3a1; one or a plurality of power modules 2 arranged above the cooling surface 3a1 and thermally connected to the cooling surface 3a1; the board 4 placed with a space from the power modules 2; and the board-retention member 6 including the extending portion 6a which extends in the first direction through the space between the board 4 and the power module 2 so as to straddle the power modules 2 from the one side to the other side in the first direction, and supports the board 4, the first fixation portion 6b which is connected to an end on the one side in the first direction of the extending portion 6a and is fixed to the cooler 3 on the one side in the first direction of the power modules 2, and the second fixation portion 6c which is connected to an end on the other side in the first direction of the extending portion 6a and is fixed to the cooler 3 on the other side in the first direction of the power modules 2. Thus, since the board 4 is supported by the board-retention member 6 at a part between the power modules 2 and the board 4, it is possible to provide the power conversion device 1 that is improved in vibration resistance while suppressing size increase of the power conversion device 1 in the first direction and the second direction.

The extending portion 6a may have, at least at a center part in the first direction, the board-fixation portion 6a1 to which the board 4 is fixed. Thus, since the board 4 is fixed to the extending portion 6a at a middle part between the power modules 2 and the board 4, the vibration resistance of the board 4 at a part between the power modules 2 and the board 4 can be efficiently improved. The extending portion 6a may have a plurality of the board-fixation portions 6a1 which are arranged in the first direction and to which the board 4 is fixed. Thus, since the board 4 is fixed to the extending portion 6a at the plurality of board-fixation portions 6a1, the vibration resistance of the board 4 can be further improved.

Each board-fixation portion 6a1 may protrude toward the board 4 side relative to a part therearound, of the extending portion 6a. Thus, the board-fixation portion 6a1 and the board 4 can assuredly contact with each other, whereby the vibration resistance of the board 4 can be assuredly improved. A part of the extending portion 6a other than the board-fixation portions 6a1 may have the groove 6a2 recessed to the side opposite to the board 4 and extending in the first direction. Thus, the weight of the extending portion 6a is reduced, so that deflection of the extending portion 6a can be suppressed, whereby the vibration resistance of the board 4 can be improved.

The extending portion 6a may have, at one or both of a part on the one side in the first direction and a part on the other side in the first direction relative to the power modules 2, a part protruding toward the cooler 3 side so as to be thermally connected to the cooling surface 3a1. Thus, heat generated at the power modules 2 can be inhibited from diffusing to the surroundings, and heat generation at the board 4 can be suppressed. The extending portion 6a may extend in the first direction through the space between the board 4 and a center part in the second direction of the power modules 2. Thus, the board 4 can be supported at the center part in the second direction of the power modules 2, whereby the extending portion 6a can stably support the board 4 in a well-balanced manner.

The plurality of power modules 2 may be placed so as to be arranged with the same orientation in the first direction such that the direction from the first side surface 2c to the second side surface 2d of each power module 2 is parallel to the first direction. Thus, since the plurality of power modules 2 are placed so as to be aligned in the same direction, the power conversion device 1 can be downsized. As seen in a direction perpendicular to the cooling surface 3a1, the distance from the retention side surface 6a4 to the board-connection portion 4c adjacent to the retention side surface 6a4 may be not less than six times the thickness of the board 4. Thus, the vibration resistances of the terminals 5 which are weak against vibration can be ensured.

A width between the third side surface 2e and the fourth side surface 2f of each power module 2 may be greater than a width between the retention side surfaces 6a4 of the extending portion 6a. Thus, the distance from the retention side surface 6a4 to the board-connection portion 4c adjacent to the retention side surface 6a4 can be ensured, whereby the vibration resistances of the terminals 5 which are weak against vibration can be ensured. If bosses for fixing the first fixation portion 6b and the second fixation portion 6c are provided to the lid portion 3a, the manufacturing cost increases. However, the first fixation portion 6b and the second fixation portion 6c may be fixed to the housing portion 3b. Thus, bosses as the fixation parts 3b1 can be easily provided to the housing portion 3b manufactured by aluminum die casting, whereby increase in the manufacturing cost for the power conversion device 1 can be suppressed.

The second moments of area of the first fixation portion 6b and the second fixation portion 6c about the X axis 10 may be greater than the second moment of area of the extending portion 6a about the X axis 10. Thus, rigidity of the board-retention member 6 can be ensured, whereby the vibration resistance of the board 4 can be improved. As seen in a direction perpendicular to the cooling surface 3a1, at least a part of the board-retention member 6 and the mounted component 4b may be located so as to overlap each other. Thus, even if the mounted component 4b is a component which is weak against vibration, since the mounted component 4b is mounted closely to the board-retention member 6, the vibration resistance of the mounted component 4b can be ensured.

The power module 2 may be molded by transfer molding. Thus, the semiconductor chip 9 can be easily protected from outside. In addition, although it is difficult to retain the board 4 at the power module 2 molded by transfer molding, since the board-retention member 6 is provided, the vibration resistance of the board 4 can be improved without retaining the board 4 at the power module 2.

The board-retention member 6 may be made of metal and the board-retention member 6 may be electrically connected to the board 4 and the housing portion 3b. Thus, the housing portion 3b which is a ground and a ground of the board 4 are connected via the board-retention member 6, whereby a ground pattern necessary for the mounted component 4b at the driving circuit 4a can be easily provided to the board 4. In addition, in the case where the board-retention member 6 is made of metal, since the Young's modulus of the board-retention member 6 is higher than that of the board 4, the vibration resistance of the board 4 can be improved.

As seen in a direction perpendicular to the cooling surface, at least a part of the semiconductor chip 9 and the board-retention member 6 may be located so as to overlap each other. Thus, since the board-retention member 6 is located between the semiconductor chip 9 and the board 4, and the board-retention member 6 is connected to the ground, the board-retention member 6 can serve as a noise shield for shielding noise occurring during switching of the semiconductor chip 9. The cooler 3 may be rigid-connected to the vibration-causing source 11 of the vehicle. Thus, with the power conversion device 1 having the configuration according to the present disclosure, it is possible to ensure the vibration resistance of the power conversion device 1 even if the cooler 3 of the power conversion device 1 is rigid-connected to the vibration-causing source 11 included in the vehicle 12 having strict requirements in vibration resistance.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

(Additional Note 1)

A power conversion device comprising:
a cooler having a cooling surface;
one or a plurality of power modules arranged above the cooling surface and thermally connected to the cooling surface;
a board placed with a space from the one or plurality of power modules on a side of the one or plurality of power modules that is opposite to the cooling surface, the board being electrically connected to a terminal of the one or plurality of power modules; and
a board-retention member, where one direction parallel to the cooling surface is defined as a first direction and a direction parallel to the cooling surface and perpendicular to the first direction is defined as a second direction, the board-retention member including
- an extending portion which extends in the first direction through the space between the board and the one or plurality of power modules so as to straddle the one or plurality of power modules from one side to another side in the first direction, and supports the board,
- a first fixation portion which is connected to an end on the one side in the first direction of the extending portion and is fixed to the cooler on the one side in the first direction of the one or plurality of power modules, and
- a second fixation portion which is connected to an end on the other side in the first direction of the extending portion and is fixed to the cooler on the other side in the first direction of the one or plurality of power modules.

(Additional Note 2)

The power conversion device according to additional note 1, wherein
the extending portion has, at least at a center part in the first direction, a board-fixation portion to which the board is fixed.

(Additional Note 3)

The power conversion device according to additional note 1, wherein
the extending portion has a plurality of board-fixation portions which are arranged in the first direction and to which the board is fixed.

(Additional Note 4)

The power conversion device according to additional note 2 or 3, wherein
each board-fixation portion protrudes toward the board side relative to a part therearound, of the extending portion.

(Additional Note 5)

The power conversion device according to additional note 4, wherein
a part of the extending portion other than the board-fixation portions has a groove recessed to a side opposite to the board and extending in the first direction.

(Additional Note 6)

The power conversion device according to any one of additional notes 1 to 5, wherein
the extending portion has, at one or both of a part on the one side in the first direction and a part on the other side in the first direction relative to the one or plurality of power modules, a part protruding toward the cooler side so as to be thermally connected to the cooling surface.

(Additional Note 7)

The power conversion device according to any one of additional notes 1 to 6, wherein
the extending portion extends in the first direction through the space between the board and a center part in the second direction of the one or plurality of power modules.

(Additional Note 8)

The power conversion device according to any one of additional notes 1 to 7, comprising a plurality of the power modules, wherein
each of the plurality of power modules includes a semiconductor chip and is formed in a rectangular parallelepiped shape having a first surface, a second surface opposite to the first surface, and four side surfaces surrounding the first surface and the second surface,
the first surfaces of the plurality of power modules are thermally connected to the cooling surface via a joining member, and
the plurality of power modules are placed so as to be arranged with the same orientation in the first direction such that a direction from a first side surface of each power module to a second side surface thereof opposite to the first side surface is parallel to the first direction.

(Additional Note 9)

The power conversion device according to additional note 8, wherein
the terminal protrudes from at least one of the second surface of each power module, a third side surface thereof, and a fourth side surface thereof opposite to the third side surface, and then extends toward the board, to be connected to the board at a board-connection portion of the board,
the extending portion has, on one side and another side in the second direction, retention side surfaces parallel to the first direction and perpendicular to the second direction, and
as seen in a direction perpendicular to the cooling surface, a distance from the retention side surface to the board-connection portion adjacent to the retention side surface is not less than six times a thickness of the board.

(Additional Note 10)

The power conversion device according to additional note 9, wherein
a width between the third side surface and the fourth side surface of each power module is greater than a width between the retention side surfaces of the extending portion.

(Additional Note 11)

The power conversion device according to any one of additional notes 1 to 10, wherein
a direction perpendicular to the first direction and the second direction is defined as a third direction,
the cooler includes a housing portion which is formed in a bottomed tubular shape having a bottom on another side in the third direction and surrounds a flow path which is provided to the cooler and through which a coolant flows, and a lid portion covering the flow path from one side in the third direction and having the cooling surface on the one side in the third direction, and
the first fixation portion and the second fixation portion are fixed to the housing portion.

(Additional Note 12)

The power conversion device according to any one of additional notes 1 to 11, wherein
an axis extending in the second direction is defined as an X axis, and
second moments of area of the first fixation portion and the second fixation portion about the X axis are greater than a second moment of area of the extending portion about the X axis.

(Additional Note 13)

The power conversion device according to any one of additional notes 1 to 12, wherein
the board has a mounted component for driving the power module, and
as seen in a direction perpendicular to the cooling surface, at least a part of the board-retention member and the mounted component are located so as to overlap each other.

(Additional Note 14)
The power conversion device according to any one of additional notes 1 to 13, wherein
the power module is molded by transfer molding.

(Additional Note 15)
The power conversion device according to additional note 11, wherein
the board-retention member is made of metal, and
the board-retention member is electrically connected to the board and the housing portion.

(Additional Note 16)
The power conversion device according to additional note 15, wherein
the power module includes a semiconductor chip, and
as seen in a direction perpendicular to the cooling surface, at least a part of the semiconductor chip and the board-retention member are located so as to overlap each other.

(Additional Note 17)
The power conversion device according to any one of additional notes 1 to 16, wherein
the cooler is rigid-connected to a vibration-causing source of a vehicle.

DESCRIPTION OF THE REFERENCE CHARACTERS 1 power conversion device
2 power module
2a first surface
2b second surface
2c first side surface
2d second side surface
2e third side surface
2f fourth side surface
3 cooler
3a lid portion
3a1 cooling surface
3b housing portion
3b1 fixation part
3b2 support portion
4 board
4a driving circuit
4b mounted component
4c board-connection portion
5 terminal
6 board-retention member
6a extending portion
6a1 board-fixation portion
6a2 groove
6a3 protrusion
6a4 retention side surface
6a5 opposed surface
6b first fixation portion
6c second fixation portion
7 power terminal
8 flow path
9 semiconductor chip
10 X axis
11 vibration-causing source
12 vehicle
D1 distance between retention side surface and board-connection portion
D2 thickness of board
D3 width between third side surface and fourth side surface
D4 width between retention side surfaces
D5 interval between second surface of power module and board

What is claimed is:

1. A power conversion device comprising:
a cooler having a cooling surface;
one or a plurality of power modules arranged above the cooling surface and thermally connected to the cooling surface;
a board placed with a space from the one or the plurality of power modules on a side of the one or the plurality of power modules that is opposite to the cooling surface, the board being electrically connected to a terminal of the one or the plurality of power modules; and
a board-retention member, where one direction parallel to the cooling surface is defined as a first direction and a direction parallel to the cooling surface and perpendicular to the first direction is defined as a second direction, the board-retention member including
an extending portion which extends in the first direction through the space between the board and the one or the plurality of power modules so as to straddle the one or the plurality of power modules from one side to another side in the first direction, and supports the board,
a first fixation portion which is connected to an end on the one side in the first direction of the extending portion and is fixed to the cooler on the one side in the first direction of the one or the plurality of power modules, and
a second fixation portion which is connected to an end on the other side in the first direction of the extending portion and is fixed to the cooler on the other side in the first direction of the one or the plurality of power modules, wherein
the terminal protrudes from at least one of a second surface of each power module of the one or the plurality of power modules, a third side surface thereof, and a fourth side surface thereof opposite to the third side surface, and then extends toward the board, to be connected to the board at a board-connection portion of the board,
the extending portion has, on one side and another side in the second direction, retention side surfaces parallel to the first direction and perpendicular to the second direction, and
as seen in a direction perpendicular to the cooling surface, a distance from a retention side surface to the board-connection portion adjacent to the retention side surface is not less than six times a thickness of the board.

2. The power conversion device according to claim 1, wherein
a width between the third side surface and the fourth side surface of each power module of the one or the plurality of power modules is greater than a width between the retention side surfaces of the extending portion.

* * * * *